(12) United States Patent
Baek

(10) Patent No.: US 6,232,590 B1
(45) Date of Patent: May 15, 2001

(54) SOLID STATE IMAGE SENSOR AND METHOD FOR FABRICATING THE SAME

(75) Inventor: Euy Hyeon Baek, Chungcheongbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/325,415

(22) Filed: Jun. 4, 1999

(30) Foreign Application Priority Data

Mar. 18, 1999 (KR) .................................................. 99-9237

(51) Int. Cl.[7] ........................ H01L 27/148; H04N 5/335
(52) U.S. Cl. ...................... 250/208.1; 250/226; 257/294; 257/432; 348/311; 438/69
(58) Field of Search ............................ 250/208.1, 208.2, 250/216, 226; 257/222, 225, 231, 232, 233, 234, 290, 291, 292, 293, 294, 431, 432, 435, 436; 348/311, 302, 340; 438/69, 70

(56) References Cited

U.S. PATENT DOCUMENTS

| | | | |
|---|---|---|---|
| 5,306,926 | 4/1994 | Yonemoto | 257/432 |
| 5,323,052 | 6/1994 | Koyama | 257/432 |
| 5,371,397 | * 12/1994 | Maegawa et al. | 257/432 |
| 5,420,634 | * 5/1995 | Matsumoto | 348/311 |
| 5,796,154 | * 8/1998 | Sano et al. | 257/432 |
| 5,854,091 | * 12/1998 | Back et al. | 438/70 |
| 6,127,668 | * 10/2000 | Baek | 250/208.1 |

* cited by examiner

*Primary Examiner*—John R. Lee
(74) *Attorney, Agent, or Firm*—Morgan, Lewis & Bockius LLP

(57) ABSTRACT

Solid state image sensor and method for fabricating the same, which can provide the same focal distances of lights incident to a photodiode through a microlens for improving a sensitivity of a CCD, the solid state image sensor including photodiode regions for generating video charges from incident lights, and charge coupled devices each formed between the photodiodes for transferring the video charges in one direction, wherein impurity ions are implanted in a portion of each of microlenses formed over, and one to one matched to the photodiode regions for varying a refractive index.

29 Claims, 9 Drawing Sheets

SOLID STATE IMAGE SENSOR AND METHOD FOR FABRICATING THE SAME

BACKGROUND OF THE INVENTION

1. Field of the Invention

The present invention relates to a solid state image sensor, and more particularly, to a solid state image sensor and a method for fabricating the same, which can improve a sensitivity and a smear of a CCD(Charge Coupled Device).

2. Background of the Invention

In general, a solid state image sensor is a device which uses a photoelectric conversion device and a charge coupled device in taking an image of an objective and providing the image as an electrical signal. The charge coupled device is used in transmission of a signal charge generated in a photoelectric conversion device(a photodiode) through a microlens and a color filter in a particular direction in a substrate utilizing a potential variation. The solid state image sensor is provided with a plurality of photoelectric conversion regions, vertical charge coupled devices(VCCDs) each one formed between the photoelectric conversion regions for vertical transmission of charges generated in the photoelectric conversion regions, a horizontal charge coupled device (HCCD) for horizontal transmission of the charge transmitted in the vertical direction by the VCCDs, and a floating diffusion region for sensing and amplifying the charges transmitted in the horizontal direction and providing to a peripheral circuit.

A related art method for fabricating an HCCD will be explained with reference to the attached drawings. FIGS. 1a~1d illustrate sections showing the steps of a related art method for fabricating a solid state image sensor.

Referring to FIG. 1a, the related art method for fabricating a solid state image sensor starts from forming a first planar layer 14 on a black and white solid state image sensor 11 which is provided with a plurality of photodiode regions PD 12 each for converting an optical image signal into an electrical signal, a plurality of vertical charge coupled devices(VCCDs) 13 each for transmitting video charges generated in the photodiode region 12 in a vertical direction, and a horizontal charge coupled device(not shown) for transmission of the video charges transmitted in the vertical direction to a horizontal direction. Then, as shown in FIG. 1b, first, second and third color filter layers 15, 16 and 17 are formed on the first planar layer 14 over the photodiode regions 12 in succession to correspond to the photodiodes 12, selectively. The color filter layers are formed by coating and patterning a dyeable resist and dying and fixing the dyeable resist layer. As shown in FIG. 1c, a second planar layer 18 is formed on an entire surface inclusive of the first, second and third color filter layers 15, 16 and 17. Then, as shown in FIG. 1d, microlenses 19 are formed on the second planar layer 18 to correspond to respective photodiode regions 12.

The operation of the related art solid state image sensor formed by the aforementioned method will be explained.

A light incident to the solid state image sensor is focused by a microlens 19, passes through one of the first, second and third color filter layers 15, 16 and 17 each of which is adapted to transmit only a particular waveform of light, and is incident to a corresponding diode 12. The light incident to the photodiode 12 is converted into an electrical signal at the photodiode region 12, and transmitted in a vertical direction and a horizontal direction in response to clock signals applied to gates on the VCCDs and the HCCD of the solid state image sensor, sensed and amplified at the floating diffusion region(not shown) at an end of the HCCD, and provided to a peripheral circuit.

FIG. 2 illustrates focal distances of a short axis and a long axis of a related art microlens.

Referring to FIG. 2, the rectangular microlens formed in conformity to the rectangular pixel in the CCD, with a difference of radii of curvatures of the long axis and the short axis, forms different focal distances of the lights incident to the photodiode through the microlens. That is, a focal distance differs depending on refractive indices of the air and a lens, and since refractive indices of the air are fixed at the same place, focal distances of the lights transmitted through the microlens to be incident to the photodiode become different due to a difference of refractive indices coming from a difference of radii of curvatures; a focal distance from the long axis is greater than a focal distance from the short axis.

However, the related art method for fabricating a solid state image sensor has the following problem.

That is, the rectangular microlens formed in conformity to the rectangular pixel in the CCD causes a loss of CCD sensitivity as much as a difference of focal distances of the lights incident to the photodiode through the microlens.

SUMMARY OF THE INVENTION

Accordingly, the present invention is directed to a solid state image sensor and a method for fabricating the same that substantially obviates one or more of the problems due to limitations and disadvantages of the related art.

An object of the present invention is to provide a solid state image sensor and a method for fabricating the same, which can provide the same focal distances of lights incident to a photodiode through a microlens for improving a sensitivity of a CCD.

Additional features and advantage s of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the solid state image sensor includes photodiode regions for generating video charges from incident lights, and charge coupled devices each formed between the photodiodes for transferring the video charges in one direction, wherein impurity ions are implanted in a portion of each of microlenses formed over, and one to one matched to the photodiode regions for varying a refractive index.

In another aspect of the present invention, there is provided a method for fabricating a solid state image sensor, including the steps of (1) forming photodiode regions for generating video charges from incident lights, (2) forming charge coupled devices between the photodiode regions for transferring the video charges in one direction, (3) forming a first planar layer on all surfaces of the photodiode regions and the charge coupled devices, (4) forming color filter layers on the first planar layer to be one to one matched to the photodiode regions, (5) forming a second planar layer on an entire surface inclusive of the color filter layers, (6) forming microlenses on the second planar layer to be one to one matched to the photodiode regions, (7) forming a mask layer on an entire surface to expose a portion of the microlens, and (8) using the mask layer as a mask in injecting impurity ions into the exposed portions of the microlenses.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
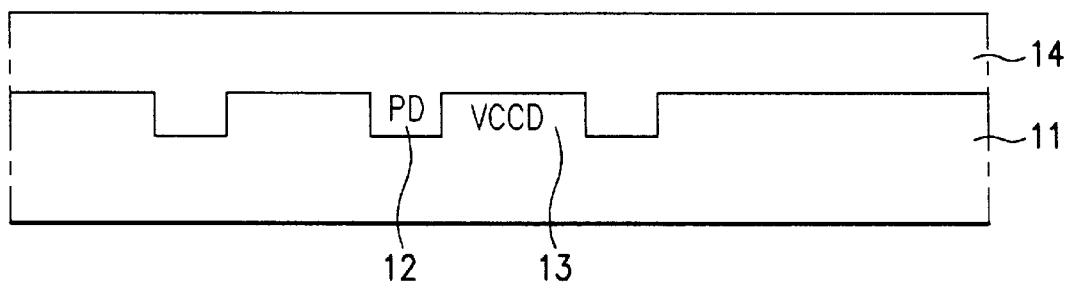
FIGS. 1a~1d illustrate sections showing the steps of a related art method for fabricating a solid state image sensor.
Figure 1B:
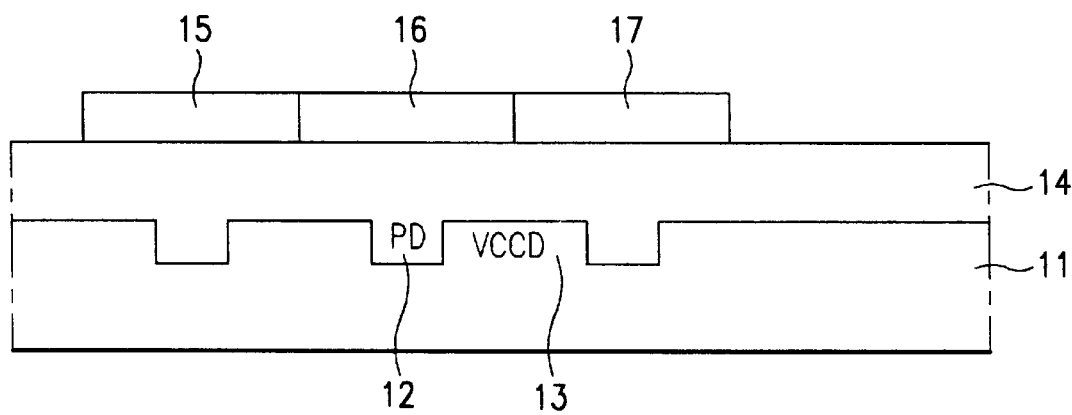
Figure 1C:
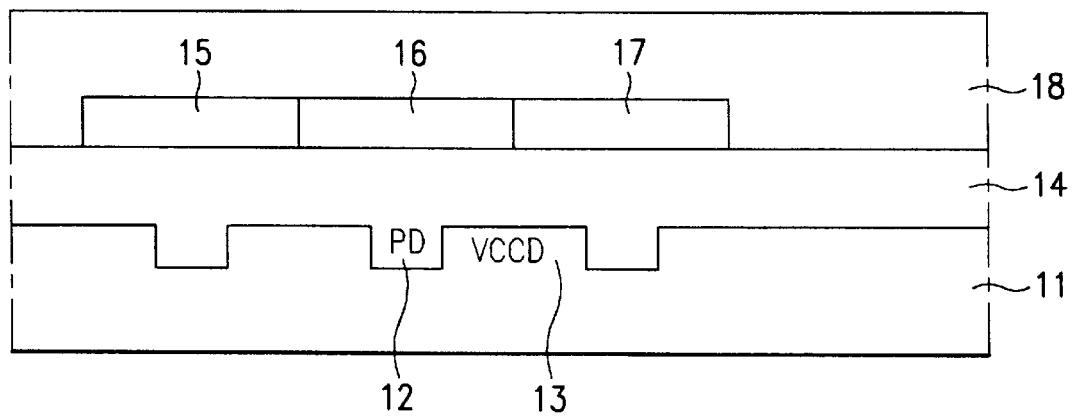
Figure 1D:
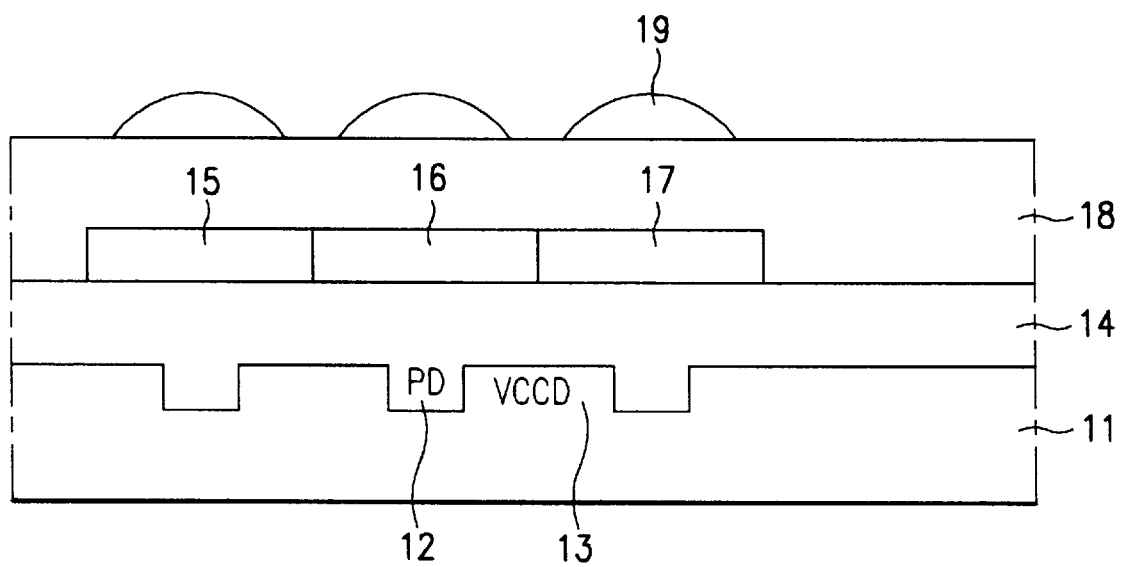
Figure 2:
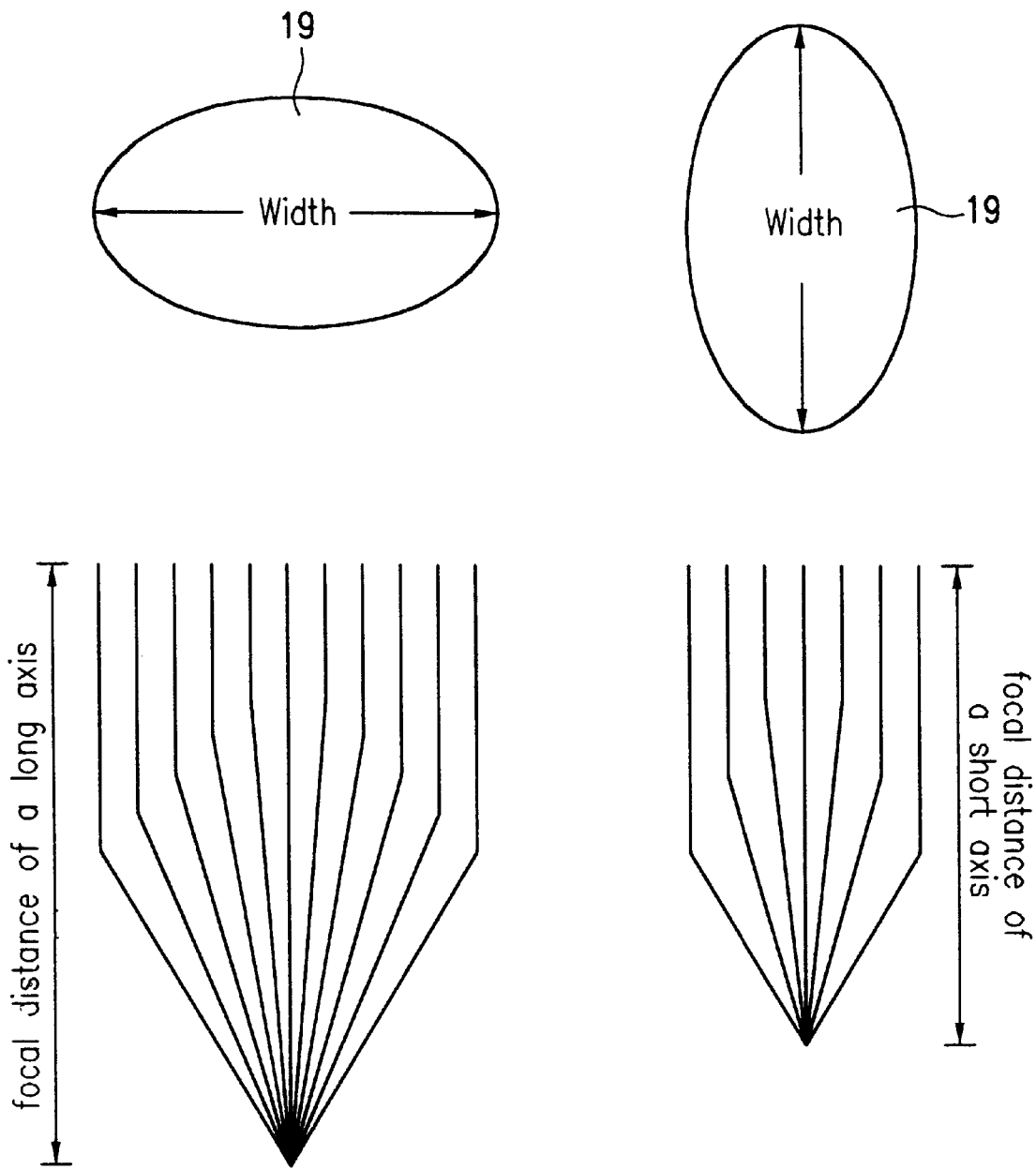
FIG. 2 illustrates focal distances of a short axis and a long axis of a related art microlens.
Figure 3:
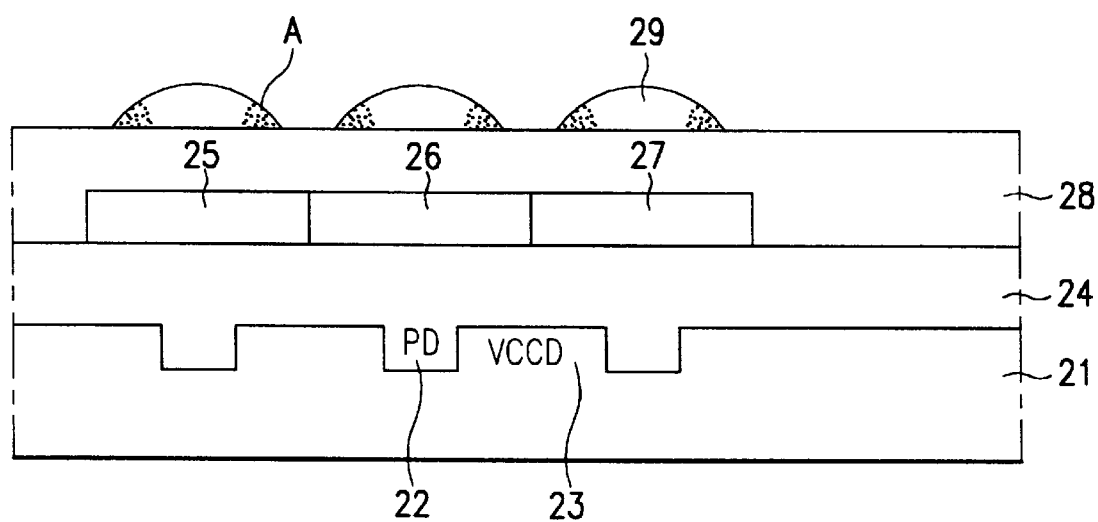
FIG. 3 illustrates a section showing a solid state image sensor in accordance with a first preferred embodiment of the present invention.

Reference will now be made in detail to the preferred embodiments of the present invention, examples of which are illustrated in the accompanying drawings. FIG. 3 illustrates a section showing a solid state image sensor in accordance with a first preferred embodiment of the present invention.

Referring to FIG. 3, the solid state image sensor in accordance with a first preferred embodiment of the present invention includes a first planar layer 24 formed on a black and white solid state image sensor 21 which is provided with a plurality of photodiode regions PD 22 each for converting an optical image signal into an electrical signal, a plurality of vertical charge coupled devices(VCCDs) 23 each for transmitting video charges generated in the photodiode region 22 in a vertical direction, and a horizontal charge coupled device(not shown) for transmission of the video charges transmitted in the vertical direction to a horizontal direction, a first, a second and a third color filter layers 25, 26 and 27 formed on the first planar layer 24 matched to respective photodiode 22 regions, and a second planar layer 28 on an entire surface inclusive of the first, second and third color filter layers 25, 26 and 27. And, there are microlenses 29 formed on the second planar layer 28 matched to respective photodiodes 22 each having impurity ions implanted at opposite end portions of a long axis or short axis to change a refractive index for focusing lights. When the impurity ions are implanted in opposite end portions of the long axis of the microlens 29 excluding a center portion, the refractive index becomes greater, and when the impurity ions are implanted in opposite end portions of the short axis of the microlens 29 excluding a center portion, the refractive index becomes smaller. 'A' in FIG. 3 denotes a portion having the impurity ions implanted therein.

FIGS. 4a~4e illustrate sections showing the steps of a method for fabricating a solid state image sensor in accordance with a first preferred embodiment of the present invention.

Figure 4A:
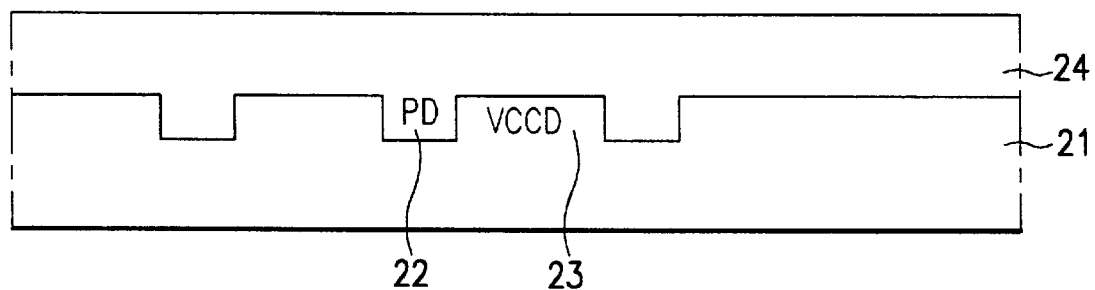
FIGS. 4a~4e illustrate sections showing the steps of a method for fabricating a solid state image sensor in accordance with a first preferred embodiment of the present invention.
Figure 4B:
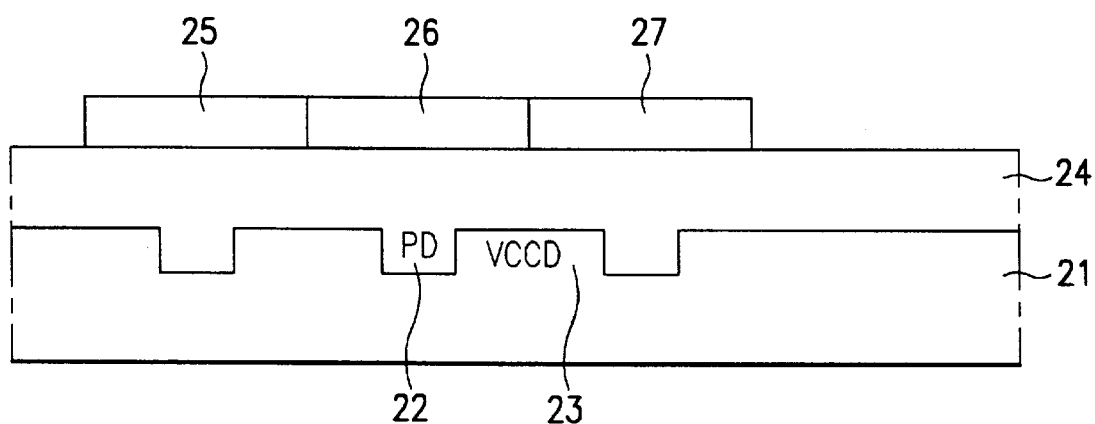
Figure 4C:
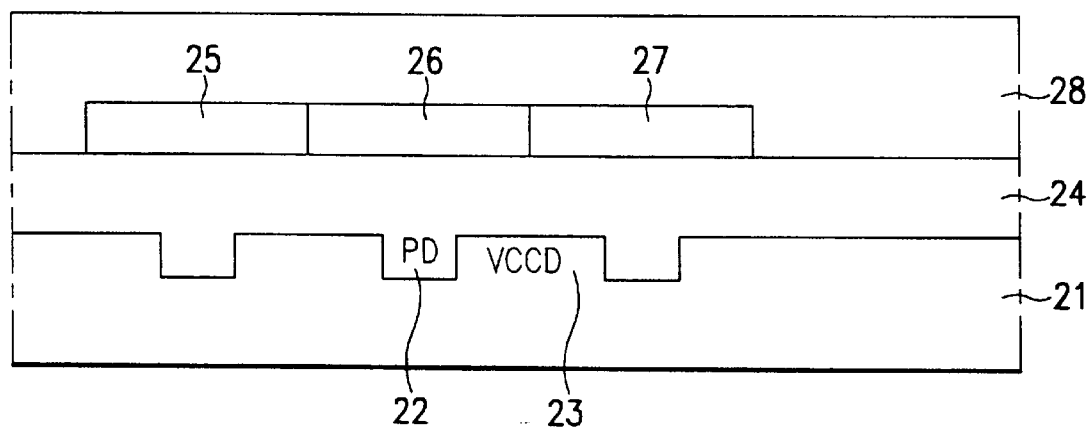
Figure 4D:
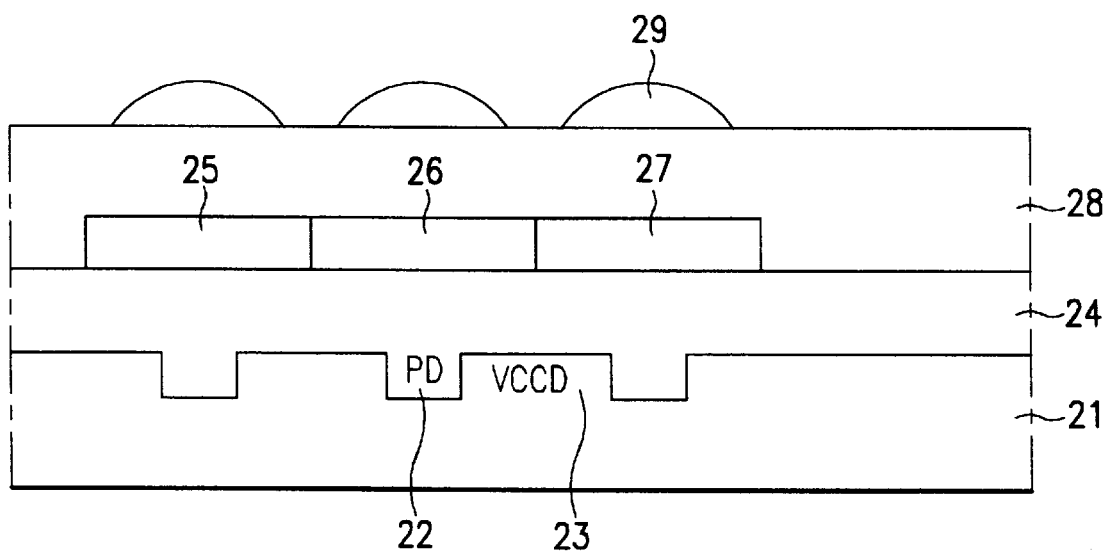
Figure 4E:
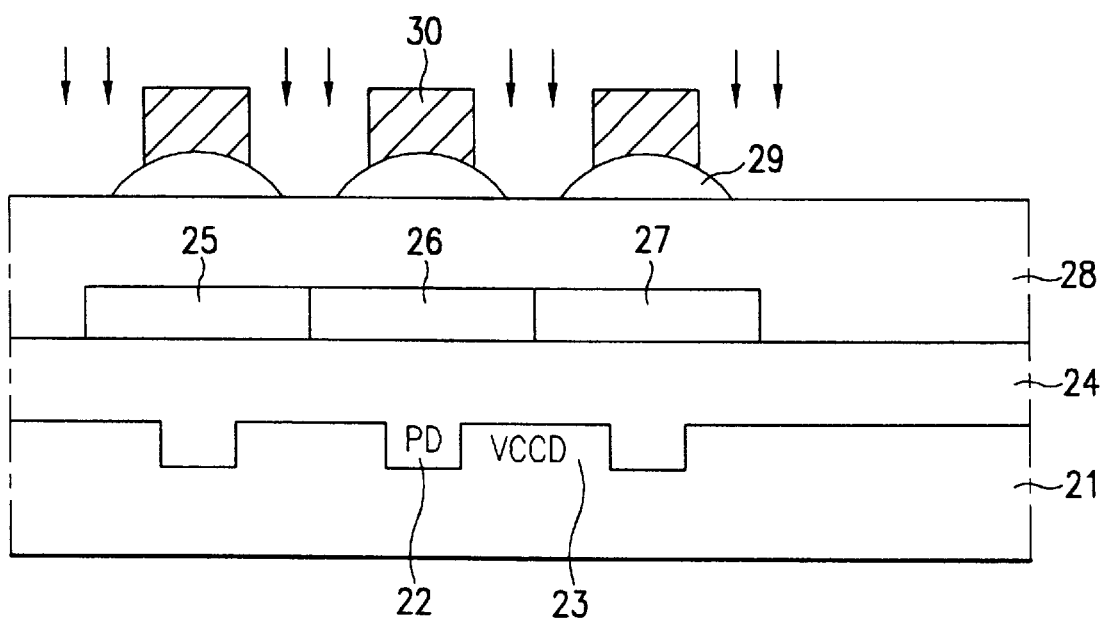
Figure 5:
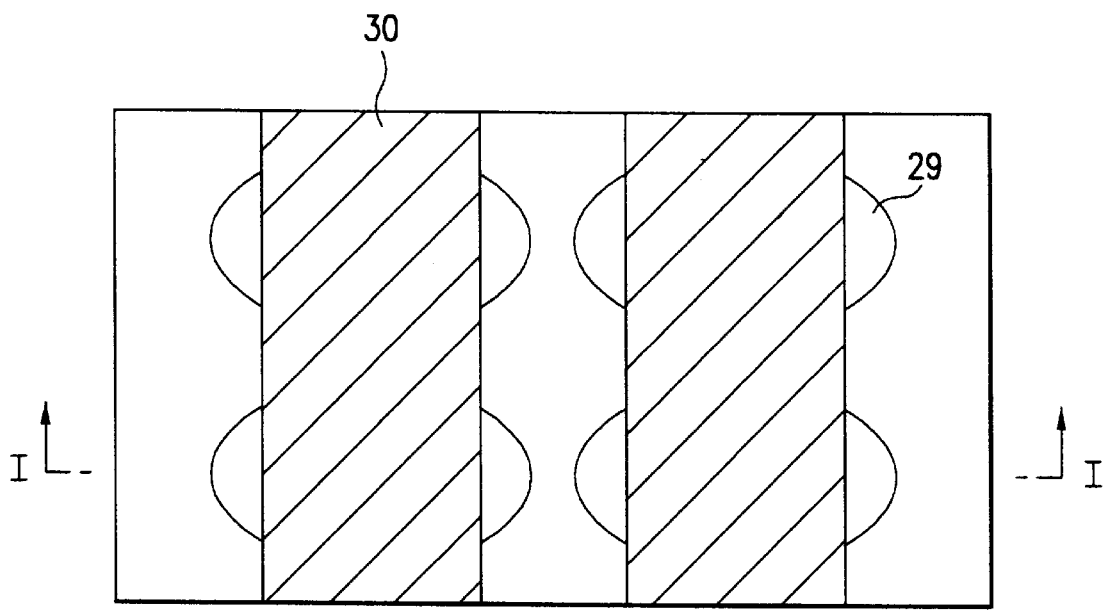
FIG. 5 illustrates a layout showing impurity ion injection at opposite ends of long axis except a center portion of a microlens.

Referring to FIG. 4a, the method for fabricating a solid state image sensor starts from forming a first planar layer 24 on a black and white solid state image sensor 21 which is provided with a plurality of photodiode regions PD 22 each for converting an optical image signal into an electrical signal, a plurality of vertical charge coupled devices (VCCDs) 23 each for transmitting video charges generated in the photodiode region 22 in a vertical direction, and a horizontal charge coupled device(not shown) for transmission of the video charges transmitted in the vertical direction to a horizontal direction. Then, as shown in FIG. 4b, a first, a second and a third color filter layers 25, 26 and 27 are formed on the first planar layer 24 over the photodiode regions 22 in succession to correspond to the photodiodes 12, selectively. The color filter layers are formed by coating and patterning a dyeable resist and dying and fixing the dyeable resist layer. As shown in FIG. 4c, a second planar layer 28 is formed on an entire surface inclusive of the first, second and third color filter layers 25, 26 and 27. The second planar layer 28 is formed of BPSG(Boron Phosphors Silicate Glass). Then, as shown in FIG. 4d, microlenses 29 are formed on the second planar layer 28 one to one matched to respective photodiode regions 22. As shown in FIG. 4e, photoresist 30 is coated on an entire surface inclusive of the microlens 29 and subjected to patterning by exposure and development, to expose opposite ends of the microlens 29 in either long or short axis direction. The patterned photoresist 30 is used as a mask in injecting impurity ions into the exposed opposite ends of the microlens 29 in the long or short axis direction excluding the center portion. FIG. 5 illustrates a layout showing impurity ion injection at opposite ends of a long axis except a center portion of a microlens. That is, FIG. 4e illustrates a section across line I—I in FIG. 5. In this instance, other materials than the photoresist 30, which can be used as a mask material, may be used. When impurity ions are injected into opposite ends of the short axis of the microlens 29, the refractive index becomes smaller, and, when impurity ions are injected into opposite ends of the long axis of the microlens 29, the refractive index becomes greater. Though not shown, thereafter, the photoresist 30 is removed, and the microlens 29 having the impurity ions implanted therein is hardened at 180~200° C.

Figure 6:
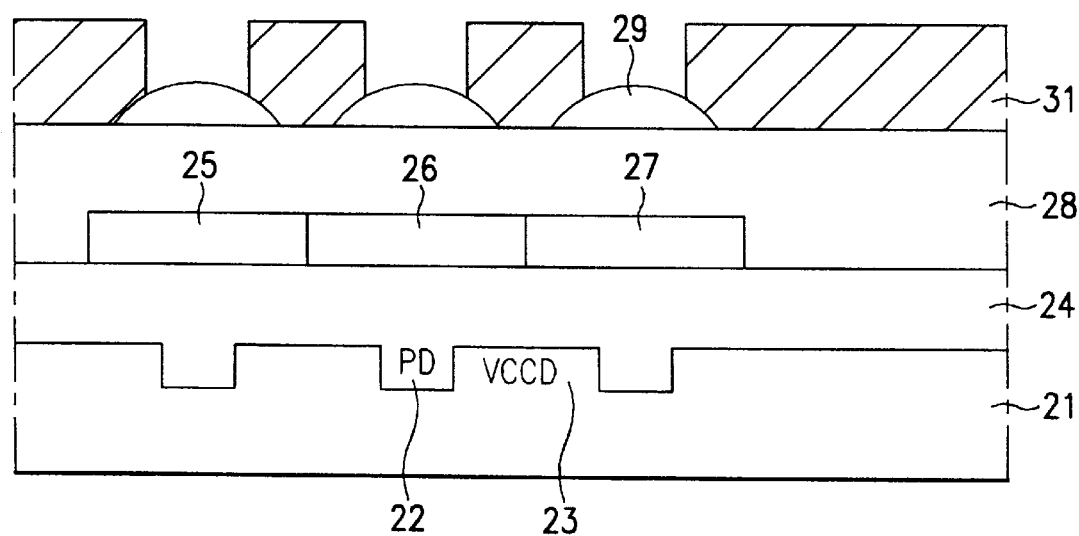
FIG. 6 illustrates a section showing a solid state image sensor in accordance with a second preferred embodiment of the present invention.

FIG. 6 illustrates a section showing a solid state image sensor in accordance with a second preferred embodiment of the present invention.

Referring to FIG. 6, the solid state image sensor in-accordance with a first preferred embodiment of the present invention includes a first planar layer 24 formed on a black and white solid state image sensor 21 which is provided with a plurality of photodiode regions PD 22 each for converting an optical image signal into an electrical signal, a plurality of vertical charge coupled devices (VCCDs) 23 each for transmitting video charges generated in the photodiode region 22 in a vertical direction, and a horizontal charge coupled device(not shown) for transmission of the video charges transmitted in the vertical direction to a horizontal direction, a first, a second and a third color filter layers 25, 26 and 27 formed on the first planar layer 24 matched to respective photodiode 22 regions, and a second planar layer 28 on an entire surface inclusive of the first, second and third color filter layers 25, 26 and 27. And, there are microlenses 29 formed on the second planar layer 28 matched to respective photodiodes 22, and portions of a material layer 31 are formed at opposite ends of a long axis or short axis excluding a center portion for changing a refractive index. When the impurity ions are implanted in opposite end portions of the long axis of the microlens 29 excluding a center portion, the refractive index becomes greater, and when the impurity ions are implanted in opposite end portions of the short axis of the microlens 29 excluding a center portion, the refractive index becomes smaller. The material layer 31 is formed of a material which changes a refractive index of a light, such as oxide and nitride.

Figure 7A:
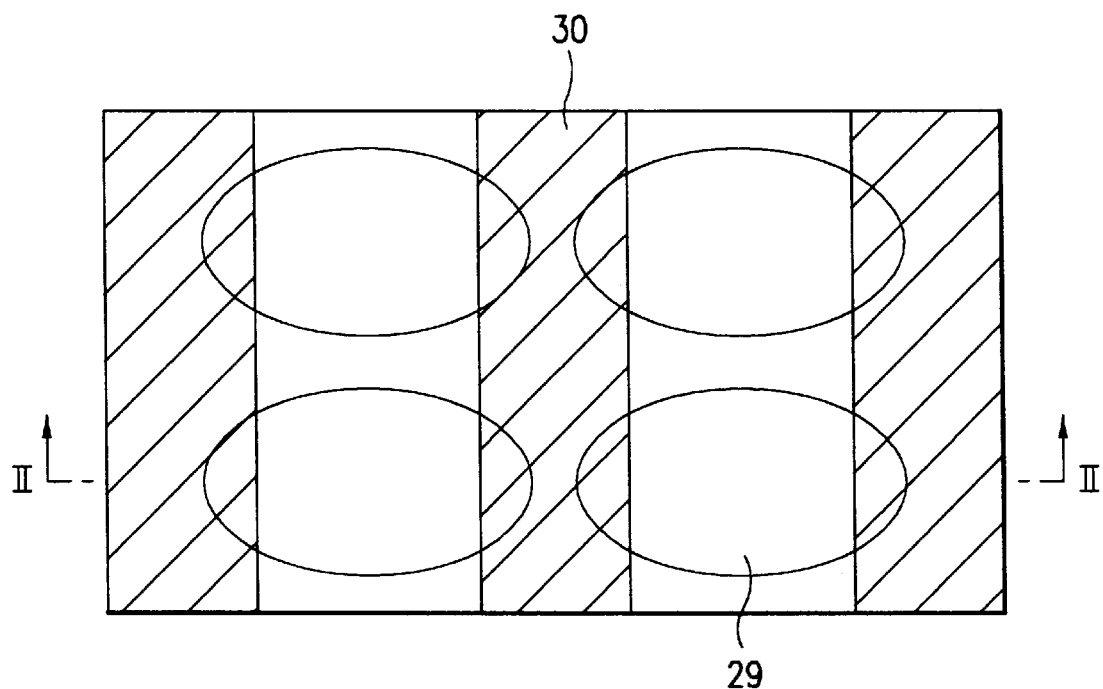
FIG. 7a illustrates a layout showing a method for fabricating a solid state image sensor in accordance with a second preferred embodiment of the present invention.
Figure 7B:
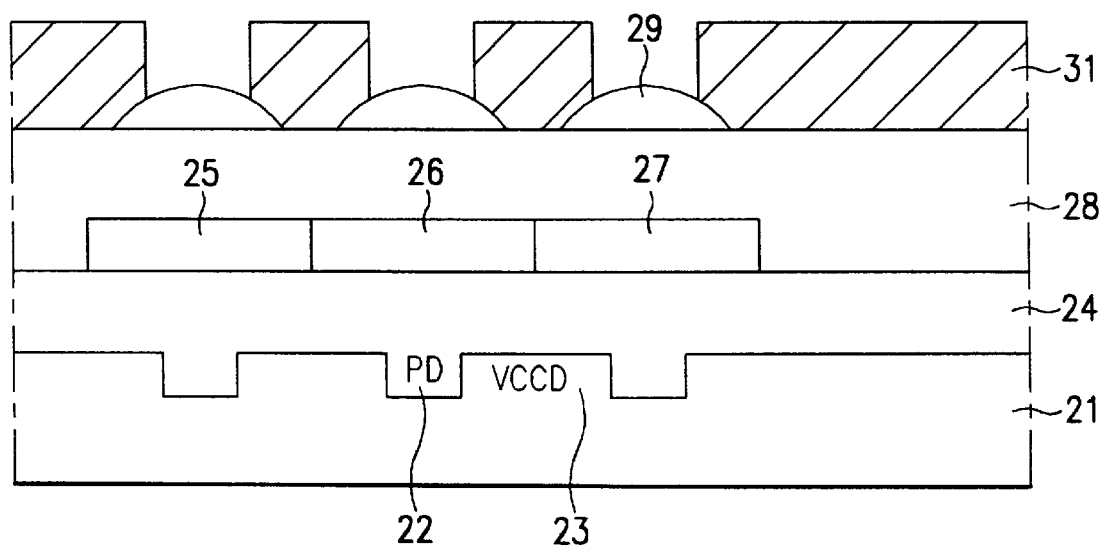
FIG. 7b illustrates a section across line II—II in FIG. 7a showing a method for fabricating a solid state image sensor; and, FIG. 8 illustrates focal distances of a short axis and a long axis of a microlens of the present invention.

FIG. 7a illustrates a layout showing a method for fabricating a solid state image sensor in accordance with a second preferred embodiment of the present invention, and FIG. 7b illustrates a section across line II—II in FIG. 7a showing a method for fabricating a solid state image sensor.

A process for forming a microlens 29 in the second embodiment of the present invention is identical to the process of the first embodiment of the present invention, and, thereafter, as shown in FIGS. 7a and 7b, a material layer 31 is formed on an entire surface inclusive of the microlens 29, and subjected to photo etching to remove the material layer 31 selectively and to leave the material layer 31 on opposite ends of a long axis or short axis of the microlens 29 only except a center portion. The material layer 31 is formed of a material with a great refractive index when the material layer 31 is to leave at opposite ends of the long axis of the microlens 29 except the center portion, and, the material layer 31 is formed of a material with a small refractive index when the material layer 31 is to leave at opposite ends of the short axis of the microlens 29 except the center portion. That is, the material layer 31 (for example, an oxide film, a nitride film, oxynitride film, or the like) is deposited at opposite ends of the long or short axis of the microlens 29 to a thickness of 1000 Å, subjected to photo etching, to leave the material layer 31 on opposite ends of the long or short axis of the microlens 29 selectively, and hardened at 180~200° C.

Figure 8:
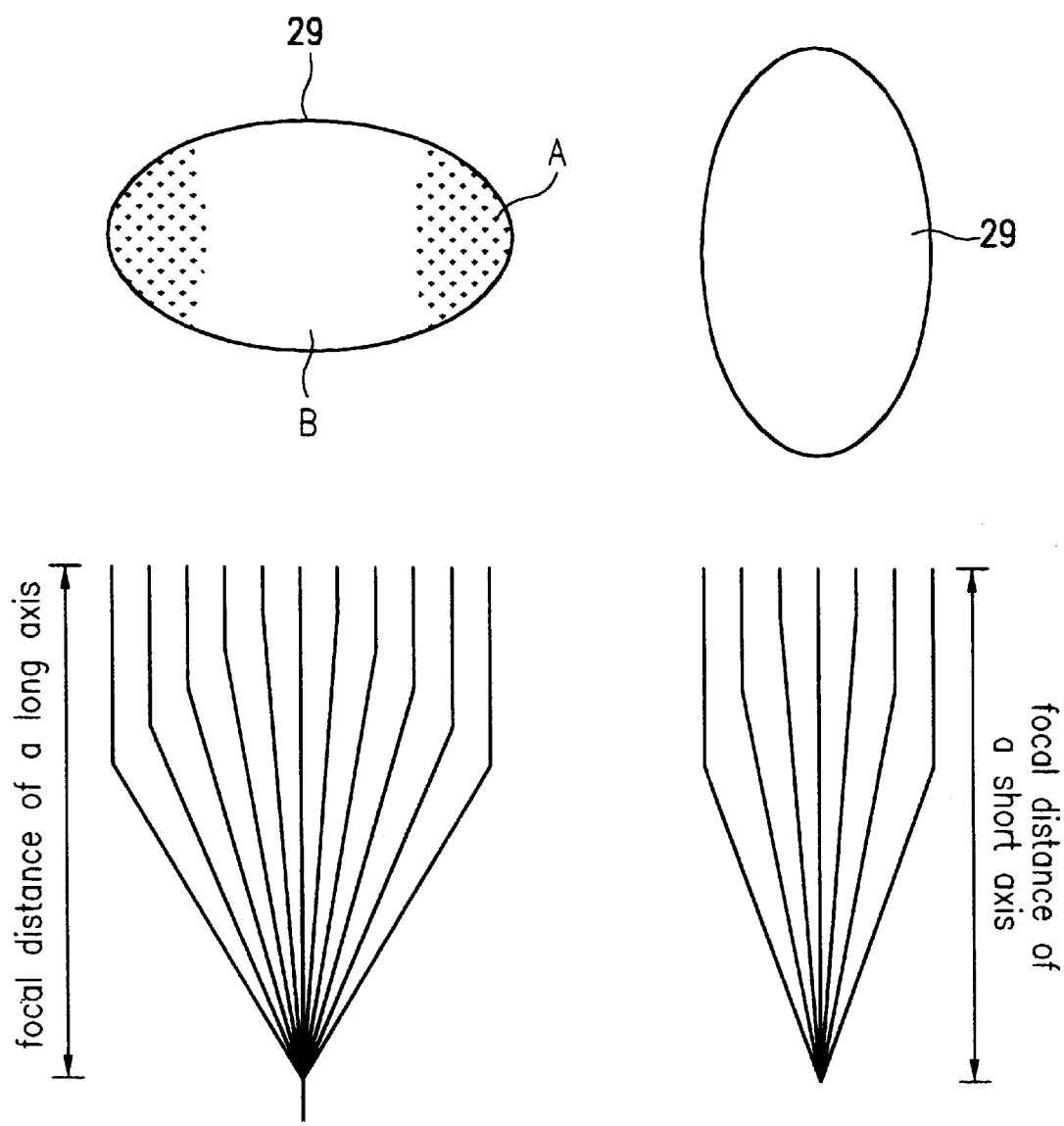

FIG. 8 illustrates focal distances of a short axis and a long axis of a microlens of the present invention, showing focal distances of lights incident to the photodiode through the microlens opposite ends of the long axis of which having impurity ions implanted therein or the material layer formed thereon in accordance with the first or second embodiments of the present invention. 'A' in FIG. 8 illustrates a region having ions implanted therein(or the material layer formed thereon), and 'B' illustrates a region having no ions implanted therein(nor the material layer formed thereon). Light refracts much in the 'A' region, opposite ends of the long axis of the microlens 29 having ions implanted therein except the center portion, due to the great refractive index, and, light refracts little in the 'B' region, opposite ends of the short axis of the microlens 29, due to the small refractive index. Opposite to this, though not shown in the drawings, light refracts little in the 'A' region, opposite ends of the short axis of the microlens 29 having ions implanted therein except the center portion, due to the small refractive index, and, 5 light refracts much in the 'B' region, opposite ends of the short axis of the microlens 29, due to the great refractive index. Thus, a difference of focal distances coming from a difference of radii of curvatures of the long axis and the short axis of the microlens 29 is eliminated by changing a refractive index of opposite ends either of the long axis or the short axis except the center portion of the microlens 29.

As has been explained, the solid state image sensor and the method for fabricating the same of the present invention have the following advantage.

Sensitivity and performance of a CCD can be improved by forming a material layer on, or implanting impurity ions into opposite ends of the long or short axis of the microlens, which changes a refractive index in the long or short axis direction of the microlens, that makes focal distances of the light incident to a photodiode through the microlens the same.

It will be apparent to those skilled in the art that various modifications and variations can be made in the solid state image sensor and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A solid state image sensor comprising:
   photodiode regions for generating video charges from incident lights; and,
   charge coupled devices each formed between the photodiodes for transferring the video charges in one direction, wherein impurity ions are implanted in a portion of each of microlenses formed over, and one to one matched to the photodiode regions for varying a refractive index.

2. A solid state image sensor as claimed in claim 1, wherein the portion of the microlens having the impurity ions implanted therein has a greater refractive index.

3. A solid state image sensor as claimed in claim 1, wherein the portion of the microlens having the impurity ions implanted therein has a smaller refractive index.

4. A solid state image sensor as claimed in claim 1, wherein the impurity ions are implanted in opposite ends of a long axis of the microlens except a center portion thereof.

5. A solid state image sensor as claimed in claim 4, wherein the opposite ends of a long axis of the microlens, except a center portion thereof, having the impurity ions implanted therein has a greater refractive index.

6. A solid state image sensor as claimed in claim 1, wherein the impurity ions are implanted in opposite ends of a short axis of the microlens except a center portion thereof.

7. A solid state image sensor as claimed in claim 6, wherein the portion of the microlens having the impurity ions implanted therein except a center portion has a smaller refractive index.

8. A solid state image sensor comprising:
   photodiode regions each for generating a video charge from a light;
   charge coupled devices each provided between the photodiode regions for transferring the video charge in one direction;
   a first planar layer formed on all surfaces of the photodiode regions and the charge coupled devices;

color filter layers formed on the first planar layer matched to respective photodiode regions; and, a second planar layer on an entire surface inclusive of the color filter layers, wherein impurity ions are implanted in opposite ends of a long axis or short axis of the microlens, except a center portion thereof, formed on the second planar layer one to one matched to the photodiode regions for varying a refractive index.

9. A solid state image sensor as claimed in claim 8, wherein the opposite ends of the long axis of the microlens having impurity ions implanted therein except the center portion has a greater refractive index.

10. A solid state image sensor as claimed in claim 8, wherein the opposite ends of the short axis of the microlens having impurity ions implanted therein except the center portion has a smaller refractive index.

11. A solid state image sensor comprising:

photodiode regions for generating video charges from incident lights;

charge coupled devices each formed between the photodiodes for transferring the video charges in one direction;

microlenses formed over the photodiode regions one to one matched thereto; and, a material layer formed on a portion of each of the microlenses for varying a refractive index.

12. A solid state image sensor as claimed in claim 11, wherein the portion of the microlens having the material layer formed thereon has a greater refractive index.

13. A solid state image sensor as claimed in claim 11, wherein the portion of the microlens having the material layer formed thereon has a smaller refractive index.

14. A solid state image sensor as claimed in claim 11, wherein the material layer is formed on opposite ends of a long axis of the microlens except a center portion.

15. A solid state image sensor as claimed in claim 14, wherein the opposite ends of the microlens having the material layer formed thereon except the center portion has a greater refractive index.

16. A solid state image sensor as claimed in claim 11, wherein the material layer is formed on opposite ends of a short axis of the microlens except a center portion.

17. A solid state image sensor as claimed in claim 16, wherein the opposite ends of the microlens having the material layer formed thereon except the center portion has a smaller refractive index.

18. A solid state image sensor as claimed in claim 11, wherein the material layer is formed of an oxide or nitride.

19. A method for fabricating a solid state image sensor, comprising the steps of:

(1) forming photodiode regions for generating video charges from incident lights;

(2) forming charge coupled devices between the photodiode regions for transferring the video charges in one direction;

(3) forming a first planar layer on all surfaces of the photodiode regions and the charge coupled devices;

(4) forming color filter layers on the first planar layer to be one to one matched to the photodiode regions;

(5) forming a second planar layer on an entire surface inclusive of the color filter layers;

(6) forming microlenses on the second planar layer to be one to one matched to the photodiode regions;

(7) forming a mask layer on an entire surface to expose a portion of the microlens; and, (8) using the mask layer as a mask in injecting impurity ions into the exposed portions of the microlenses.

20. A method as claimed in claim 19, wherein the mask layer is formed of photoresist.

21. A method as claimed in claim 19, further comprising the step of hardening the microlenses having the impurity ions implanted therein at 180~200° C.

22. A solid state image sensor as claimed in claim 19, wherein a refractive index is made greater by implanting the impurity ions into opposite ends of a long axis of the microlens except a center portion.

23. A solid state image sensor as claimed in claim 19, wherein a refractive index is made smaller by implanting the impurity ions into opposite ends of a short axis of the microlens except a center portion.

24. A method for fabricating a solid state image sensor, comprising the steps of:

(1) forming photodiode regions for generating video charges from incident lights;

(2) forming charge coupled devices between the photo diode regions for transferring the video charges in one direction;

(3) forming a first planar layer on all surfaces of the photodiode regions and the charge coupled devices;

(4) forming color filter layers on the first planar layer to be one to one matched to the photodiode regions;

(5) forming a second planar layer on an entire surface inclusive of the color filter layers;

(6) forming microlenses on the second planar layer to be one to one matched to the photodiode regions; and, (7) forming a material layer on a portion of the microlens for varying a refractive index.

25. A method as claimed in claim 24, wherein the refractive index is made greater by forming a material layer on opposite ends of a long axis of the microlens except a center portion.

26. A method as claimed in claim 24, wherein the refractive index is made smaller by forming a material layer on opposite ends of a short axis of the microlens except a center portion.

27. A method as claimed in claim 24, wherein the material layer is formed of oxide or nitride.

28. A method as claimed in claim 24, further comprising the step of hardening the microlenses having the material layer formed thereon.

29. A method as claimed in claim 24, wherein the material layer is formed to a thickness of approx. 1000 Å.

* * * * *